(12) United States Patent
Le Rhun et al.

(10) Patent No.: US 11,035,734 B2
(45) Date of Patent: Jun. 15, 2021

(54) PYROELECTRIC DETECTION DEVICE WITH STRESSED SUSPENDED MEMBRANE

(71) Applicant: COMMISSARIAT A L'ENERGIE ATOMIQUE ET AUX ENERGIES ALTERNATIVES, Paris (FR)

(72) Inventors: Gwenael Le Rhun, Grenoble (FR); Stephane Fanget, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 189 days.

(21) Appl. No.: 16/514,090

(22) Filed: Jul. 17, 2019

(65) Prior Publication Data

US 2020/0025620 A1 Jan. 23, 2020

(30) Foreign Application Priority Data

Jul. 18, 2018 (FR) ...................................... 18 56658

(51) Int. Cl.
*G01J 5/34* (2006.01)
*G01J 5/02* (2006.01)
(Continued)

(52) U.S. Cl.
CPC ............... *G01J 5/34* (2013.01); *G01J 5/0225* (2013.01); *H01L 37/025* (2013.01); *G01J 2005/0077* (2013.01)

(58) Field of Classification Search
CPC .... G01J 5/34; G01J 5/0225; G01J 2005/0077; G01J 5/044; G01J 5/024; H01L 37/025; H01L 37/02
(Continued)

(56) References Cited

U.S. PATENT DOCUMENTS 9,389,125 B2 * 7/2016 Yon
10,003,008 B2 * 6/2018 Fanget
(Continued)

FOREIGN PATENT DOCUMENTS

EP 1 998 153 A1 12/2008
FR 3084208 B1 * 10/2020 ................ G01J 5/34
(Continued)

OTHER PUBLICATIONS

French Preliminary Search Report dated May 27, 2019 in French Application 18 56658 filed on Jul. 18, 2018 (with English Translation of Categories of Cited Documents).
(Continued)

*Primary Examiner* — David P Porta
*Assistant Examiner* — Gisselle M Gutierrez
(74) *Attorney, Agent, or Firm* — Oblon, McClelland, Maier & Neustadt, L.L.P.

(57) ABSTRACT

Pyroelectric detection device, comprising at least:
a suspended membrane;
a pyroelectric detection element located on the suspended membrane and comprising at least one portion of pyroelectric material located between first and second electrodes, the first electrode being located between said at least one portion of pyroelectric material and the suspended membrane;
and in which the membrane and the pyroelectric detection element are subjected to a higher compression stress than a limiting buckling stress of the suspended membrane and the pyroelectric detection element and together form a bistable structure.

14 Claims, 2 Drawing Sheets

(51) Int. Cl.
*H01L 37/02* (2006.01)
*G01J 5/00* (2006.01)

(58) Field of Classification Search
USPC .................................................... 250/338.3
See application file for complete search history.

(56) References Cited

U.S. PATENT DOCUMENTS

| 10,411,434 | B2 * | 9/2019 | Reboud |
| 10,666,019 | B2 * | 5/2020 | Reboud |
| 2009/0072143 | A1 | 3/2009 | Ishida et al. |
| 2010/0059724 | A1 | 3/2010 | Lubomirsky et al. |
| 2011/0182320 | A1 * | 7/2011 | Noda |
| 2013/0015353 | A1 | 1/2013 | Tai et al. |

FOREIGN PATENT DOCUMENTS

| JP | 2014-153188 | 8/2014 | |
| JP | 2014153188 A * | 8/2014 | ................ G01J 1/02 |
| WO | WO 2007/144892 A2 | 12/2007 | |

OTHER PUBLICATIONS

M. Kohli, et al., "Pyroelectric thin film sensor array", Sensors and Actuators A: Physical, vol. 60, Issues 1-3, May 1997, pp. 147-153.
T. Qiu-Lin, et al., "Design, fabrication and characterization of pyroelectric thin film and its application for infrared gas sensors", Microelectronics Journal, vol. 40, Issue 1, Jan. 2009, pp. 58-62.
R.W. Whatmore: "Pyroelectric devices and materials", Rep. Prog. Phys. 49, 1986, pp. 1335-1386 and coversheet.

* cited by examiner

PYROELECTRIC DETECTION DEVICE WITH STRESSED SUSPENDED MEMBRANE

TECHNICAL DOMAIN AND PRIOR ART

This document relates to a pyroelectric detection device with stressed suspended membrane, and a method of making such a device. It applies to the field of infrared (IR) detection, for example for gas detection or to form an infrared imager used for example to detect movement or to detect presence.

In an infrared detection device, infrared radiation received by a pyroelectric material of the device induces a change in the temperature of this material. This temperature change causes a variation in the polarization of the pyroelectric material, creating circulation of an electric current through this material to obtain a voltage at the output from the device.

The pyroelectric material has a spontaneous polarization, the amplitude of which varies as a function of the temperature. Therefore a variation of electric charges can be measured when the intensity of the received infrared flux varies.

Manufacturing of such an infrared detection device is based on technological processes conventionally used to manufacture MEMS (microelectromechanical systems) devices. The substrate used generally comprises silicon but other materials can be used (glass, sapphire, flexible polymer substrate, etc.).

The substrate can be etched to form a suspended membrane on which the pyroelectric material lies, in order to obtain good thermal insulation between the pyroelectric material and the substrate and thus limit losses due to thermal conduction through the substrate. The document "Pyroelectric thin film sensor array" by M. Kohli, Sensors and Actuators A: Physical, vol. 60, Issues 1-3, pages 147-153, May 1997, describes an infrared detection device fabricated in this manner.

The document "Design, fabrication and characterization of pyroelectric thin film and its application for infrared gas sensors" by T. Qiu-Lin et al, Microelectronics Journal, vol. 40, Issue 1, pages 58-62, January 2009, describes that a problem related to this type of device comprising a pyroelectric material placed on a suspended membrane lies in its sensitivity to mechanical stresses and vibrations because all pyroelectric materials are also piezoelectric. Therefore a parasite current is generated in the pyroelectric material due to mechanical stresses and vibrations applied to the device due to the piezoelectric properties of the pyroelectric material. The generation of such a parasite current is called the microphonic effect or microphony. Variations of the ambient temperature and brightness to which the detector is exposed also generate a parasite signal that is superposed on the output voltage signal from the detector corresponding to the measurement made.

One possible response to these problems disclosed in this document is to make two pyroelectric detection elements which are arranged side by side on the suspended membrane, forming two stacks each comprising a portion of pyroelectric material located between a front electrode and a back electrode, with identical dimensions and electrically connected to each other in series through their front electrodes. In this configuration, the device is not very sensitive to common mode interference such as sensitivity to acceleration caused by mechanical vibration, since the directions of induced polarization in the two detection elements are opposite. Therefore such a device can improve the detection capacity. However, this improvement in the detection capacity requires manufacturing of two detection elements side by side, which is voluminous and expensive to make.

In the document «Pyroelectric devices and materials» by R. Whatmore, Rep. Prog. Phys. 49 (1986), pages 1335-1386, other solutions are also proposed to minimise noise related to this piezoelectric effect in infrared detection devices with pyroelectric material. However, each of the different solutions proposed in this document has at least one of the following disadvantages:
 need for a very rigid packaging inside which the pyroelectric detector is located;
 need to use a compensation structure;
 need to suspend the detector on a polymer film that would tend to decouple the detector from deformations related to the packaging;
 need to use a pyroelectric material with low piezoelectric coefficients.

JP 2014 153188 A discloses a pyroelectric device comprising a suspended membrane and a pyroelectric detection element arranged on the suspended membrane. In this device, the membrane is deformed concavely or convexly in order to improve the response of the device. The deformation of the membrane is obtained by producing it in the form of a stack of several layers subjected to different stresses and/or by applying a pressure on one side of the membrane to deform it. This deformation makes it possible to reduce the dielectric permittivity of the pyroelectric material and thus to increase the sensitivity of the device. However, this device does not provide a solution to the problem of generating parasitic electric loads when the device is subjected to shock or vibration.

EP 1 998 153 A1 discloses a flexible pyroelectric device comprising a suspended membrane connected at its periphery to a rigid ring, and a pyroelectric detection element arranged on the suspended membrane. All the elements of the device are flexible in order to give a desired shape to the device. Such a device therefore does not provide solution to the problem of generating parasitic loads when the device is subjected to shock or vibration.

PRESENTATION OF THE INVENTION

Thus there is a need to disclose a pyroelectric detection device that does not have the disadvantages of prior art described above.

To achieve this, one embodiment discloses a pyroelectric detection device, comprising at least:
 a suspended membrane;
 a pyroelectric detection element located on the suspended membrane and comprising at least one portion of pyroelectric material placed between first and second electrodes, the first electrode being located between the portion of pyroelectric material and the suspended membrane;
 and in which the membrane and the pyroelectric detection element are subjected to a higher compression stress than a limiting buckling stress of the membrane and the pyroelectric detection element and together form a bistable structure.

The disclosed pyroelectric detector comprises a suspended membrane, for example comprising one or several "elastic" layers that provide mechanical strength for the pyroelectric membrane, and at least one pyroelectric detection element forming a capacitor comprising a pyroelectric material located between two electrodes. The assembly comprising the suspended membrane and the pyroelectric detection element is subject to a higher compression stress than the limiting buckling stress of this assembly, in other words the absolute value is larger than the absolute value of the limiting buckling stress, and therefore causes buckling of this assembly. This assembly forms a bistable structure and is in one of the two stable states.

Thus, when a mechanical stress is applied to this assembly such as a shock, vibrations of the membrane and the pyroelectric detection element are very strongly attenuated because this assembly is blocked in its current stability state due to the compression stress applied to the membrane and the pyroelectric detection element. Any electrical charges that may be generated by this shock are then ideally zero or in any case are very low or even negligible.

If piezoelectric charges are generated, they will be characteristic of piezoelectric noise and therefore more easily identifiable. Therefore, by using the read electronics, it will be possible to detect these charges that will have a particular signature (due to the bistable state of the suspended membrane and the pyroelectric detection element), and to subtract them from the global signal formed by charges related to the pyroelectric effect, for example by digital processing performed by a computer.

The buckled structure furthermore makes it possible to obtain a better alignment of the ferroelectric dipoles in one of the up or down polarization directions, because of the important state of stress related to buckling, and therefore a better stability of the state of polarization of the pyroelectric sensing element and a better measuring sensitivity of the sensor.

For the understanding of the invention, it should be noted that it is possible that a pyroelectric element comprising a membrane is deformed concavely or convexly without being buckled. In this case, this element is subjected to a stress lower than the limiting buckling stress of this element. Such a deformed element will, on the other hand, be sensitive to mechanical vibrations or to the pressure exerted on it, and will not respond to the problem of parasitic electric charge generation when the device is subjected to shock or vibration.

In contrast to the invention in which the bistable structure obtained is blocked in a state of concave or convex deformation, a pyroelectric structure which is not subjected to a compressive stress greater than the limiting buckling stress of this structure is not blocked in a state of deformation and can be easily deformed by application of a mechanical stress (vibration, shock, pressure, etc.) or electrical (piezoelectric actuation).

Throughout the document, the term "on" is used without distinction of the orientation in space of the element to which this term applies. For example, in the "pyroelectric detection element located on the suspended membrane" characteristic, the face of the membrane on which the pyroelectric detection element is located is not necessarily oriented upwards, but may correspond to a face oriented in any direction. Moreover, the arrangement of a first element on a second element should be understood as meaning the arrangement of the first element in direct contact with the second element, without any intermediate element between the first and the second elements, or as possibly corresponding to the arrangement of the first element on the second element with one or several intermediate elements positioned between the first and the second elements.

In the pyroelectric detection device, the membrane is qualified as suspended because it comprises one or several parts, for example edges, rigidly fixed to a fixed part of the device, and one or several other parts, for example a central part of the membrane, free to move relative to this fixed part of the device. According to another example embodiment, the membrane may be suspended by arms, in other words the membrane is rigidly attached to the fixed part (for example formed by a substrate), discontinuously.

The membrane comprises one or several layers of materials.

The total thickness of the bistable structure may for example be between about 100 nm and 100 µm.

The membrane and the pyroelectric detection element are subjected to a compressive stress, in other words the materials of the membrane and the pyroelectric detection element are subjected to one or several forces oriented such that they cause contraction of these materials.

The limiting buckling stress of the membrane and the pyroelectric detection element corresponds to the compressive stress with a value above which the membrane and the pyroelectric detection element are affected by a transverse instability phenomenon under the action of this stress, that is called buckling.

A bistable structure is a structure that has only two mechanically stable states generated by the compressive stress, in other words the global compressive stress, of the pyroelectric membrane structure formed by the suspended membrane and the pyroelectric detection element.

The suspended membrane may comprise $SiO_2$ and/or Si and/or SiN.

The device may also comprise a substrate in which at least one cavity is formed, the membrane possibly comprising edges fixed to the substrate and at least one suspended part located facing the cavity. In this case the substrate belongs to the fixed part of the device from which the membrane is suspended.

The pyroelectric detection element may comprise a black body formed by the second electrode and/or by a portion of material absorbing infrared radiation, located on the second electrode.

Thus, the second electrode may act as an electrode and also an infrared radiation absorber. The material of the second electrode may be different from the material of the first electrode, and/or the thickness of the second electrode may be different from the thickness of the first electrode, particularly when the second electrode acts as both electrode and infrared radiation absorber. For example, the first electrode may comprise platinum, and the second electrode may comprise a material configured such that the second electrode performs electrode and infrared radiation absorber functions, for example such as Ni, Ni—Cr or TiN.

The black body corresponds to an element absorbing electromagnetic energy received by the pyroelectric detection device.

The material absorbing infrared radiation may comprise TiN and/or Ni—Cr and/or Ni and/or black metal such that platinum black, black gold, etc.

The device may be such that:
the pyroelectric material corresponds to at least one of the following materials: PZT (Lead Titano-Zirconate, or $Pb(Zr_x,Ti_{1-x})O_3$), doped PZT (Mn, La, Nb, etc.), AlN, KNN (($K$, $Na)NbO_3$), NBT-BT (($1-x)Na_{0.5}Bi_{0.5}TiO_3$-$xBaTiO_3$), PMN-PT ($Pb(Mg_{1/3}Nb_{2/3})O_3$—$PbTiO_3$), LTO (Lithium tantalate, or $LiTaO_3$), LNO (Lithium niobate, or $LiNbO_3$), PVDF, and/or
the first electrode comprises platinum, and/or
the second electrode comprises at least one of the following materials: Pt, Ru, Ir, TiW, Au, Ni, Ni—Cr, TiN.

The suspended membrane may be discontinuous, i.e. holey and/or pierced.

Another embodiment relates to a method of fabricating a pyroelectric detection device comprising at least:

fabrication of a suspended membrane;

fabrication of a pyroelectric detection element located on the suspended membrane and comprising at least one portion of pyroelectric material placed between first and second electrodes, the first electrode being located between the portion of pyroelectric material and the suspended membrane;

and in which the membrane and the pyroelectric detection element are subjected to a higher compression stress than a limiting buckling stress of the membrane and the pyroelectric detection element and together form a bistable structure.

The suspended membrane may be obtained by making at least one layer of material stressed in compression on a substrate, that will form the suspended membrane, then after making the pyroelectric detection element on said at least one layer of material, making at least one cavity in the substrate, releasing at least part of the membrane that is suspended facing the cavity.

Said at least one layer of material stressed in compression may be made by thermal oxidation of the substrate that comprises at least one semiconductor, and/or by deposition of $SiO_2$ on the substrate.

Fabrication of the pyroelectric detection element may include use of the following steps:

fabrication of at least a first electrode layer on said at least one layer of material stressed in compression;

fabrication of at least one layer of pyroelectric material on the first electrode layer;

fabrication of at least one second electrode layer on the layer of pyroelectric material;

structuring of each of the first and second layers of electrodes and the layer of pyroelectric material such that the remaining portions of these layers form the pyroelectric detection element.

In this case, the method may also comprise a step to deposit at least one layer of material absorbing infrared radiation on the second electrode layer between the step to deposit the second electrode layer and the structuring step, and wherein the structuring step is also carried out for the layer of infrared radiation absorption material such that a remaining portion of this layer of infrared radiation absorption material located on the second electrode forms part of a black body of the pyroelectric detection element.

The second electrode layer may comprise a thickness and a material such that the second electrode forms part of the black body of the pyroelectric detection element.

BRIEF DESCRIPTION OF THE DRAWINGS

This invention will be better understood after reading the description of example embodiments given purely for information and that is in no way limitative with reference to the appended drawings on which.

Identical, similar or equivalent parts of the different figures described below have the same numeric references to facilitate comparison between the different figures.

The different parts shown on the figures are not necessarily all at the same scale, to make the figures more easily understandable.

The different possibilities (variants and embodiments) must be understood as not being mutually exclusive and can be combined with each other.

DETAILED PRESENTATION OF PARTICULAR EMBODIMENTS

Figure 1:
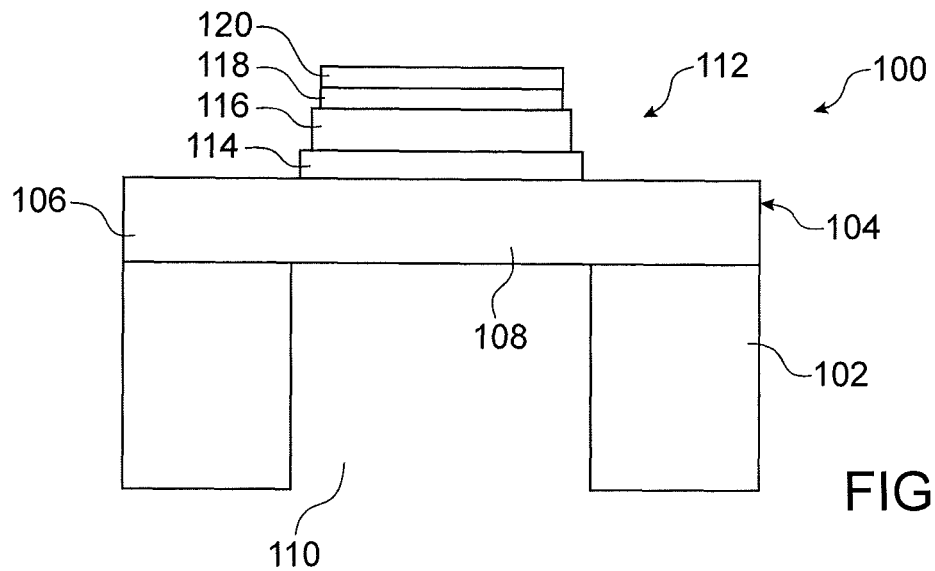
FIG. 1 shows a pyroelectric detection device according to one particular embodiment.

Refer to FIG. 1 that shows a pyroelectric detection device according to one particular embodiment.

The device 100 comprises a substrate 102. The substrate 102 advantageously comprises a semiconductor, for example silicon.

The device 100 also comprises a suspended membrane 104. In the particular embodiment described herein, the membrane 104 comprises one or several layers, comprising at least one of the following materials: $SiO_2$, Si, SiN. The membrane 104 is qualified as suspended because it comprises edges 106 or ends, fixed to the substrate 102, and a free central part 108, in other words that is not in contact with the substrate 102, located facing a cavity 110 formed through the substrate 102.

As a variant, it is possible that the membrane 104 is suspended from the substrate 102 through arms, for example comprising portions of material extending between specific parts of the membrane 104 and the fixed part of the substrate 102.

The device 100 also comprises a pyroelectric detection element 112 placed on the membrane 104. This element 112 comprises:

a lower electrode 114;
a portion 116 of pyroelectric material;
an upper electrode 118;
a portion 120 of infrared radiation absorption material.

The lower electrode 114 is located on the membrane 104. The portion 116 of pyroelectric material is located between the lower and upper electrodes 114, 118. The portion 120 of infrared radiation absorption material is located on the upper electrode 118.

The lower electrode 114 advantageously comprises platinum, which facilitates growth of the pyroelectric material in portion 116. The upper electrode 118, 110 comprises for example at least one of the following materials: Pt, Ru, Ir, TiW, Au. Each of the lower 114 and upper 118 electrodes may for example be between 10 nm and 200 nm thick. Although it cannot be seen, an adhesion layer may be located between the membrane 104 and the lower electrode 114. This adhesion layer comprises for example $TiO_2$ or any other material adapted such that the lower electrode 114 adheres well to the membrane 104, and for example is between about 2 nm and 40 nm thick.

The portion 116 of pyroelectric material advantageously comprises PZT, but more generally may comprise at least one of the following materials: PZT, AlN, KNN, NBT-BT, PMN-PT, LTO, LNO, PVDF. The thickness of the portion 116 of pyroelectric material may for example be between about 50 nm and 2 µm.

The portion 120 of absorbing material comprises at least one of the following materials: TiN and/or Ni—Cr and/or Ni and/or black metal (platinum black, black gold, etc.). The thickness of the portion 120 may for example be between about 1 nm and 5 µm.

A compressive stress, or compression stress, is applied to the membrane 104, such that the assembly formed by the membrane 104 and the element 112 is subjected to a higher compressive stress than the limiting buckling stress of this assembly, that causes buckling of this assembly that forms a bistable structure, in other words it can be in one of two stable positions.

Figure 2:
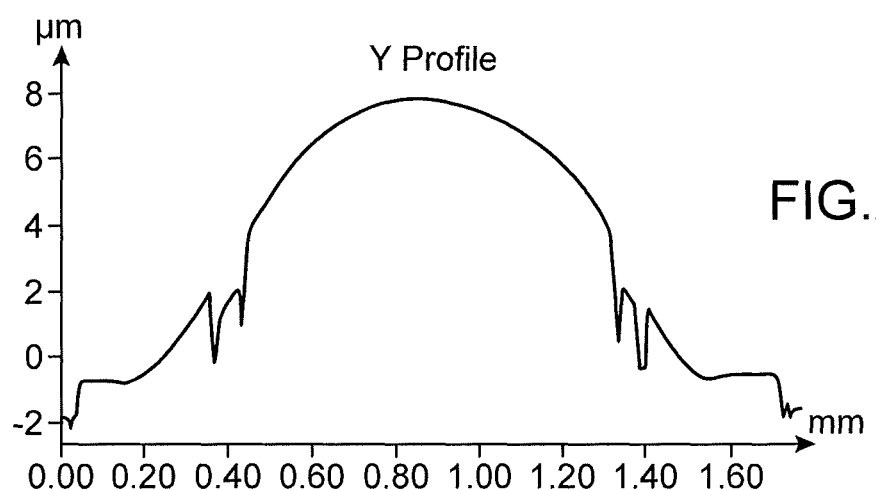
FIGS. 2 and 3 show measurements made by a profilometer of the surface of the pyroelectric detection device when the suspended membrane is in one of the two stable positions.

A first stable position of this assembly 104+112 is a position in which this assembly 104+112 is curved, such that the central part 108 of the membrane 104 is outside the plane in which the edges 106 of the membrane 104 that are in contact with the substrate 102 are located, and projects from the side of the pyroelectric detection element 112. This first stable position is shown on FIG. 2 that corresponds to a measurement made by a profilometer of the surface of the device 100 located in this first stable position.

Figure 3:
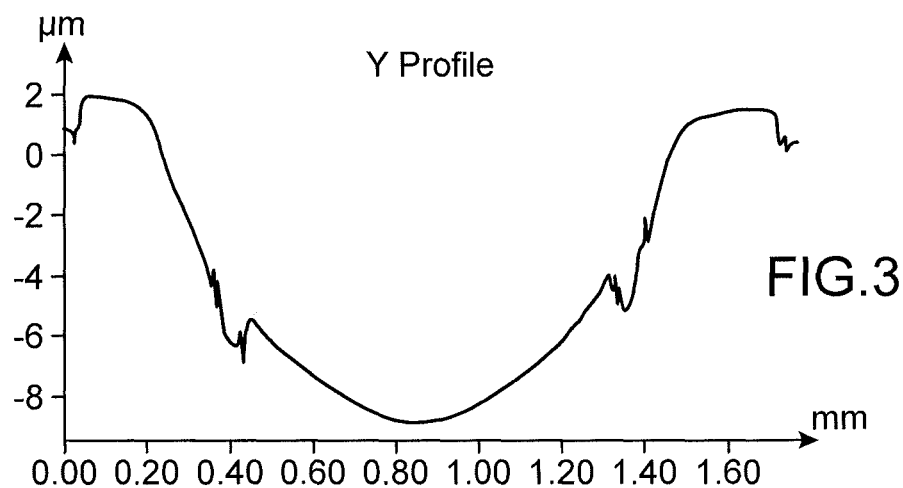

A second stable position of the assembly 104+112 is a position in which this assembly 104+112 is curved, such that the central part 108 of the membrane 104 is outside the plane in which the edges 106 of the membrane 104 that are in contact with the substrate 102 are located, and projects from the side of the cavity 110. This second stable position is shown on FIG. 3 that corresponds to a measurement made by a profilometer of the surface of the device 100 located in this second stable position.

To obtain buckling of the assembly formed by the membrane 104 and the pyroelectric detection element 112 and for it to form a bistable structure, the mechanical parameters of the layers forming this assembly are chosen in an appropriate manner to obtain this result. The following parameters are considered and are judiciously chosen:

the dimensions and particularly the thickness of the different layers of the membrane 104 and the pyroelectric detection element 112;

the value of the stress in the different layers of the membrane 104 and the pyroelectric detection element 112;

Young's Modulus and Poisson's ratio of the materials in the different layers of the membrane 104 and the pyroelectric detection element 112;

The limiting buckling stress $\sigma_{buckling\_limit}$ for a circular single-layer membrane structure is given by the following formula:

$$\sigma_{limite\_flambage} = 14.68 \cdot \frac{D}{r^2 \cdot t \cdot 10^6}$$

In which $$D = E \cdot \frac{t^3}{12 \cdot (1 - \vartheta^2)}$$

Where D is the bending stiffness, r is the radius of the membrane, t is the thickness of the membrane, E is Young's Modulus and $\vartheta$ is Poisson's ratio. For a multilayer structure, as is the case herein with the assembly formed from the membrane 104 and the pyroelectric detection element 112, its limiting buckling stress is calculated as a first approximation by considering this assembly as an equivalent single-layer structure with mechanical parameters (Young's modulus, Poisson's ratio, stress) calculated by the average weighted by the ratio of the thickness of each layer to the total thickness, namely as follows for n layers:

$$Eeq = \frac{\sum_{i=1}^{n} t_i E_i}{\sum_{i=1}^{n} t_i},$$

the equivalent Young's modulus, $$veq = \frac{\sum_{i=1}^{n} t_i v_i}{\sum_{i=1}^{n} t_i},$$

the equivalent Poisson's ratio, $$\sigma eq = \frac{\sum_{i=1}^{n} t_i \sigma_i}{\sum_{i=1}^{n} t_i},$$

the equivalent stress.

For example, for a device 100 comprising:

a suspended membrane 104 that is circular in shape, with a radius equal to 400 µm and formed by an elastic layer of $SiO_2$ with thickness equal to 1 µm (E=70 GPa, vv=0.18, σ=−200 MPa), a lower electrode 114 comprising platinum with a thickness equal to 0.1 µm (E=180 GPa, v=0.3, σ=600 MPa), a portion 116 made of PZT with a thickness equal to 0.5 µm (E=80 GPa, v=0.39, σ=50 MPa), an upper electrode 118 comprising platinum with a thickness equal to 0.05 µm (E=180 GPa, v=0.3, σ=100 MPa), and a portion 120 comprising TiN with a thickness equal to 0.05 µm (E=360 GPa, v=0.3, σ=1000 MPa), the calculated limiting buckling stress (in compression) is equal to −2 MPa. However, since the equivalent stress of the stack is −35 MPa, therefore with an absolute value higher than the limiting buckling stress, the membrane 104 and the element 112 are buckled.

The change from one of the two stable states of the membrane 104 to the other may be made by applying a relatively high voltage to the terminals of the first and second electrodes 114, 118, for example between about 10 V and 20 V and/or by applying a sufficiently high mechanical stress (therefore corresponding to a force higher than the force holding the membrane 104 in one of its two stable positions) on one of the main faces of the membrane 104 depending on the stable position in which the membrane 104 is to be positioned.

An example of a method of fabricating the device 100 is described below with reference to FIGS. 4 and 5.

Figure 4:
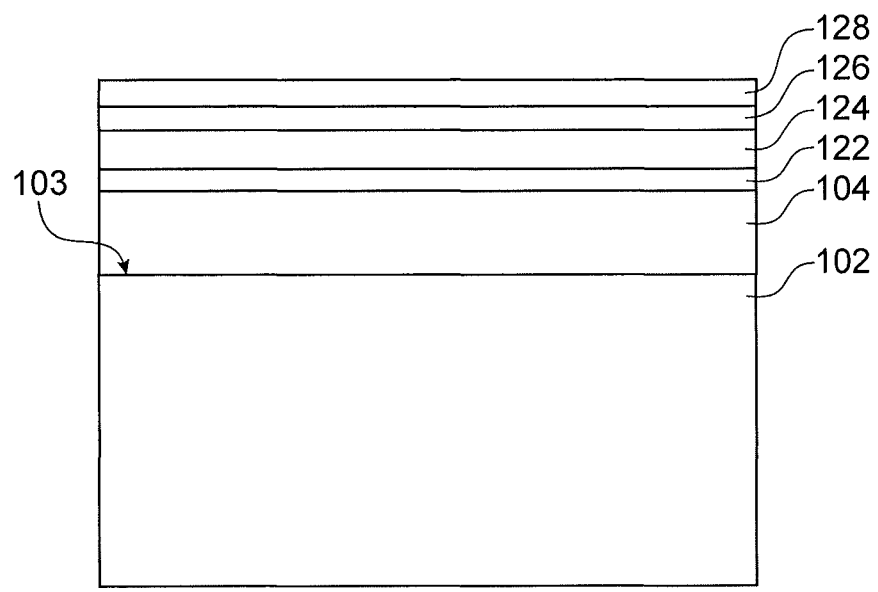
FIGS. 4 and 5 show steps in a method of making a pyroelectric detection device according to one particular embodiment.

As shown on FIG. 4, one (or several) layers 104 of material stressed in compression and that will form the suspended membrane is/are made on a front face 103 of the substrate 102. In the example embodiment described herein, the substrate 102 comprises silicon and the layer 104 comprises $SiO_2$. According to a first example, the layer 104 may be made by thermal oxidation from the front face 103 of the substrate 102. According to a second example, the layer 104 may be formed by a deposition, for example a PECVD (plasma enhanced chemical vapour deposition), of $SiO_2$, advantageously followed by a densification corresponding for example to annealing in an oven under oxygen, at a temperature equal for example to about 800° C. and for a duration equal to about 3 hours. The layer 104 thus made is in compression due to the state of compression stress inherent to SiO₂.

At least one first electrode layer 122 that will form the lower electrode 114 is then deposited on the layer 104. In the example embodiment described herein, the first electrode layer 122 comprises platinum. Advantageously, the deposition of this first electrode layer 122 is preceded by a deposition of a bond layer (not visible on FIG. 4) corresponding for example to a layer of TiO₂ deposited on the layer 104, the first electrode layer 122 then being deposited on this bond layer.

At least one layer 124 of pyroelectric material that will form the portion 116 of pyroelectric material is then deposited on the first electrode layer 122. This layer 124 is formed for example by a sol-gel type method or by cathodic sputtering or by pulsed laser ablation.

At least one second electrode layer 126, for example comprising platinum, that will form the upper electrode 118 is then deposited on the layer 124.

A layer 128 of material absorbing infrared radiation that will form the portion 120 is then deposited on the second electrode layer 126.

Figure 5:
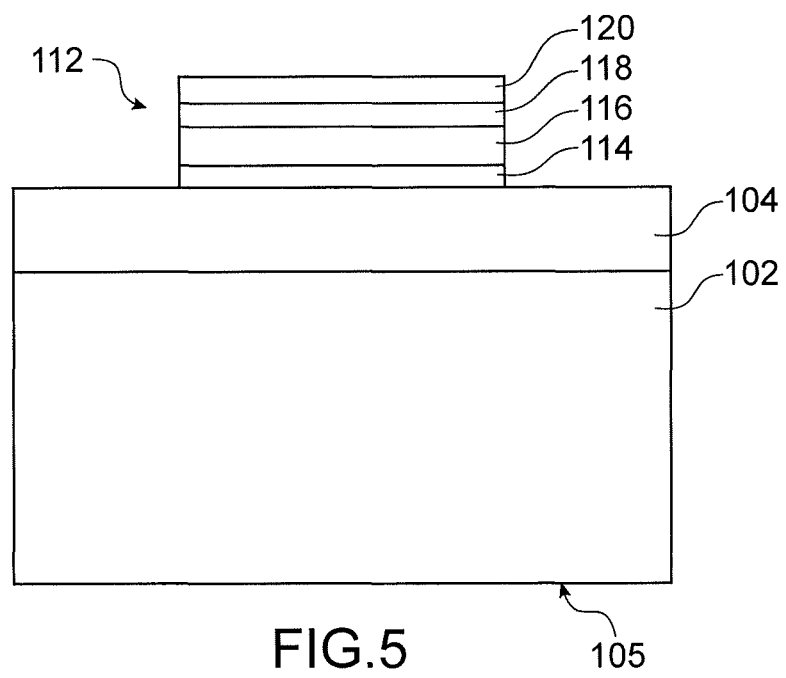

Each of the layers 122, 124, 126 and 128 is then structured, for example by lithography, etching and stripping, such that the remaining portions 114, 116, 118 and 120 of these layers form the pyroelectric detection element 112 (see FIG. 5).

The device 100 is completed by forming the cavity 110 from a back face 105 of the substrate 102, to release the central part 108 of the membrane 104. For example, this etching may correspond to deep reactive ion etching (DRIE). The device 100 obtained corresponds to that shown on FIG. 1.

As an alternative, the layer(s) of the suspended membrane 104 may be discontinuous, i.e. holey and/or pierced.

The invention claimed is:

1. Pyroelectric detection device, comprising at least:
   a suspended membrane;
   a pyroelectric detection element located on the suspended membrane and comprising at least one portion of pyroelectric material located between first and second electrodes, the first electrode being located between said at least one portion of pyroelectric material and the suspended membrane;
   and in which the suspended membrane and the pyroelectric detection element are subjected to a higher compression stress than a limiting buckling stress of the suspended membrane and the pyroelectric detection element and together form a bistable structure.

2. The pyroelectric detection device according to claim 1, wherein the suspended membrane comprises at least one of the following materials: SiO₂, Si, SiN.

3. The pyroelectric detection device according to claim 1, also comprising a substrate in which at least one cavity is formed, the suspended membrane comprising edges fixed to the substrate and at least one suspended part located facing said at least one cavity.

4. The pyroelectric detection device according to claim 1, wherein the pyroelectric detection element comprises a black body comprising at least one of the second electrode and a portion of material absorbing infrared radiation located on the second electrode.

5. The pyroelectric detection device according to claim 4, wherein the material absorbing infrared radiation comprises at least one of the following materials: TiN, Ni—Cr, Ni, black metal such that platinum black or black gold.

6. The pyroelectric detection device according to claim 1, wherein the pyroelectric material corresponds to at least one of the following materials: PZT, AlN, KNN, NBT-BT, PMN-PT, LTO, LNO, PVDF.

7. The pyroelectric detection device according to claim 1, wherein the first electrode comprises platinum.

8. The pyroelectric detection device according to claim 1, wherein the second electrode comprises at least one of the following materials: Pt, Ru, Ir, TiW, Au, Ni, Ni—Cr, TiN.

9. Method of fabricating a pyroelectric detection device, comprising at least:
   fabrication of a suspended membrane;
   fabrication of a pyroelectric detection element located on the suspended membrane and comprising at least one portion of pyroelectric material located between first and second electrodes, the first electrode being located between said at least one portion of pyroelectric material and the suspended membrane;
   and in which the suspended membrane and the pyroelectric detection element are subjected to a higher compression stress than a limiting buckling stress of the suspended membrane and the pyroelectric detection element and together form a bistable structure.

10. The method according to claim 9, wherein the suspended membrane is obtained by making at least one layer of material stressed in compression that will form the suspended membrane on a substrate, then after making the pyroelectric detection element on said at least one layer of material, making at least one cavity in the substrate, releasing at least part of the suspended membrane that is suspended facing said at least one cavity.

11. The method according to claim 10, wherein said at least one layer of material stressed in compression is made by thermal oxidation of the substrate that comprises at least one semiconductor, and/or by deposition of SiO₂ on the substrate.

12. The method according to claim 10, wherein fabrication of the pyroelectric detection element includes the following steps:
   fabrication of at least one first electrode layer on said at least one layer of material stressed in compression;
   fabrication of at least one layer of pyroelectric material on said at least one first electrode layer;
   fabrication of at least one second electrode layer on said at least one layer of pyroelectric material;
   structuring of each of said at least one first electrode layer and said at least one second electrode layer and of said at least one layer of pyroelectric material such that remaining portions of these layers form the pyroelectric detection element.

13. The method according to claim 12, also comprising a step to deposit at least one layer of material absorbing infrared radiation on said at least one second electrode layer between the step to deposit said at least one second electrode layer and the structuring step, and wherein the structuring step is also carried out for said at least one layer of material absorbing infrared radiation such that a remaining portion of said at least one layer of material absorbing infrared radiation located on the second electrode forms part of a black body of the pyroelectric detection element.

14. The method according to claim 12, wherein said at least one second electrode layer comprises a thickness and a material such that the second electrode forms part of the black body of the pyroelectric detection element.

\* \* \* \* \*